(12) United States Patent
Bettencourt et al.

(10) Patent No.: US 8,344,359 B2
(45) Date of Patent: Jan. 1, 2013

(54) TRANSISTOR HAVING THERMO ELECTRON COOLING

(75) Inventors: John P. Bettencourt, Danvers, MA (US); Nicholas J. Kolias, Somerville, MA (US)

(73) Assignee: Raytheon Company, Waltham, MA (US)

( * ) Notice: Subject to any disclaimer, the term of this patent is extended or adjusted under 35 U.S.C. 154(b) by 326 days.

(21) Appl. No.: 12/757,590

(22) Filed: Apr. 9, 2010

(65) Prior Publication Data

US 2011/0248280 A1    Oct. 13, 2011

(51) Int. Cl.
H01L 29/06 (2006.01)
(52) U.S. Cl. ............ 257/27; 257/20; 257/24; 257/183; 257/184; 257/185; 257/187; 257/189; 257/192; 257/211; 257/213
(58) Field of Classification Search ............ 257/20, 257/24, 27, 192, 211, 213, 741, 187, 183, 257/184, 185, 189
See application file for complete search history.

(56) References Cited

U.S. PATENT DOCUMENTS

| | | | |
|---|---|---|---|
| 6,559,538 B1 | 5/2003 | Pomerene et al. | |
| 6,800,933 B1 | 10/2004 | Mathews et al. | |
| 2008/0067546 A1* | 3/2008 | Murata et al. | 257/192 |
| 2010/0090250 A1* | 4/2010 | Murata et al. | 257/192 |

* cited by examiner

*Primary Examiner* — Long Tran
(74) *Attorney, Agent, or Firm* — Daly, Crowley, Mofford & Durkee, LLP

(57) ABSTRACT

A semiconductor structure having a transistor and a thermo electronic structure. The transistor has a control electrode for controlling a flow of carriers through a semiconductor layer between a pair of electrodes. The thermo electronic structure has a first portion disposed on at least one of the pair of electrodes and a second portion disposed over a region of the semiconductor layer proximate the control electrode between the control electrode and said at least one of the pair of electrode. The thermo electronic structure extends from the first portion to the second portion for removing heat generated heat from said region in the semiconductor layer.

14 Claims, 3 Drawing Sheets

TRANSISTOR HAVING THERMO ELECTRON COOLING

TECHNICAL FIELD

This disclosure relates generally to semiconductor structures and more particularly to methods and structures for cooling such semiconductor structures.

BACKGROUND

As is known in the art, Gallium Nitride (GaN) based transistors have been shown to deliver 5 to 10 times more power than Gallium Arsenide based transistors. This higher power density makes GaN transistors the preferred choice for next generation high power electronics. However, with the higher power density there is also higher power dissipation and heat generation. Removing this heat from transistor channel area is critical for reliable transistor operation.

Prior attempts to remove heat from the transistor channel area have included adding high thermal conductivity substrates such as diamond and Silicon-Carbide under the GaN transistor, and also adding thermal bumps on the source and drain contacts of the transistor.

SUMMARY

In accordance with the present disclosure, a semiconductor structure is provided having a transistor and a thermo electronic structure. The transistor has a control electrode for controlling a flow of carriers through a semiconductor layer between a pair of electrodes. The thermo electronic structure has a first portion disposed on at least one of the pair of electrodes and a second portion disposed over a region of the semiconductor layer proximate the control electrode between the control electrodes and said at least one of the pair of electrode. The thermo electronic structure extends from the first portion to the second portion for removing heat generated heat from said region in the semiconductor layer.

In one embodiment, the transistor is a field effect transistor and the electrodes are source and a drain contacts.

In one embodiment, the transistor is a GaN based transistor.

In one embodiment, the semiconductor structure includes a first dielectric layer disposed between said first portion of the thermo electronic structure and said at least one of the pair of contacts. The thermo electronic structure includes a pair of layers of different materials. The first portion of the thermo electronic structure includes a second dielectric layer disposed between the pair of layers. The second portion of the thermo electronic structure includes the pair of layers in contact one with the other.

In one embodiment, the pair of layers in the second portion of the thermo electronic structure form a Peltier effect.

In one embodiment, a semiconductor structure includes a transistor having an elongated control electrode for controlling a flow of carriers through a semiconductor layer between a pair of electrodes; and a plurality of the thermo electronic structures disposed parallel to the elongated control electrode.

In accordance with the disclosure, the thermoelectric Peltier junctions are used to redistribute the heat generated in the transistor channel area. By redistributing and spreading the heat out from the transistor, the peak transistor channel temperature is reduced. The Peltier junctions are formed at the interface between 2 dissimilar conducting materials—in one embodiment, the Peltier junction is formed at the interface between the ohmic contact metal and the GaN epitaxial layer. Thus, a compact, integrated thermoelectric heat pump located within the transistor is provided that effectively pumps heat away from the transistor's channel area.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1:
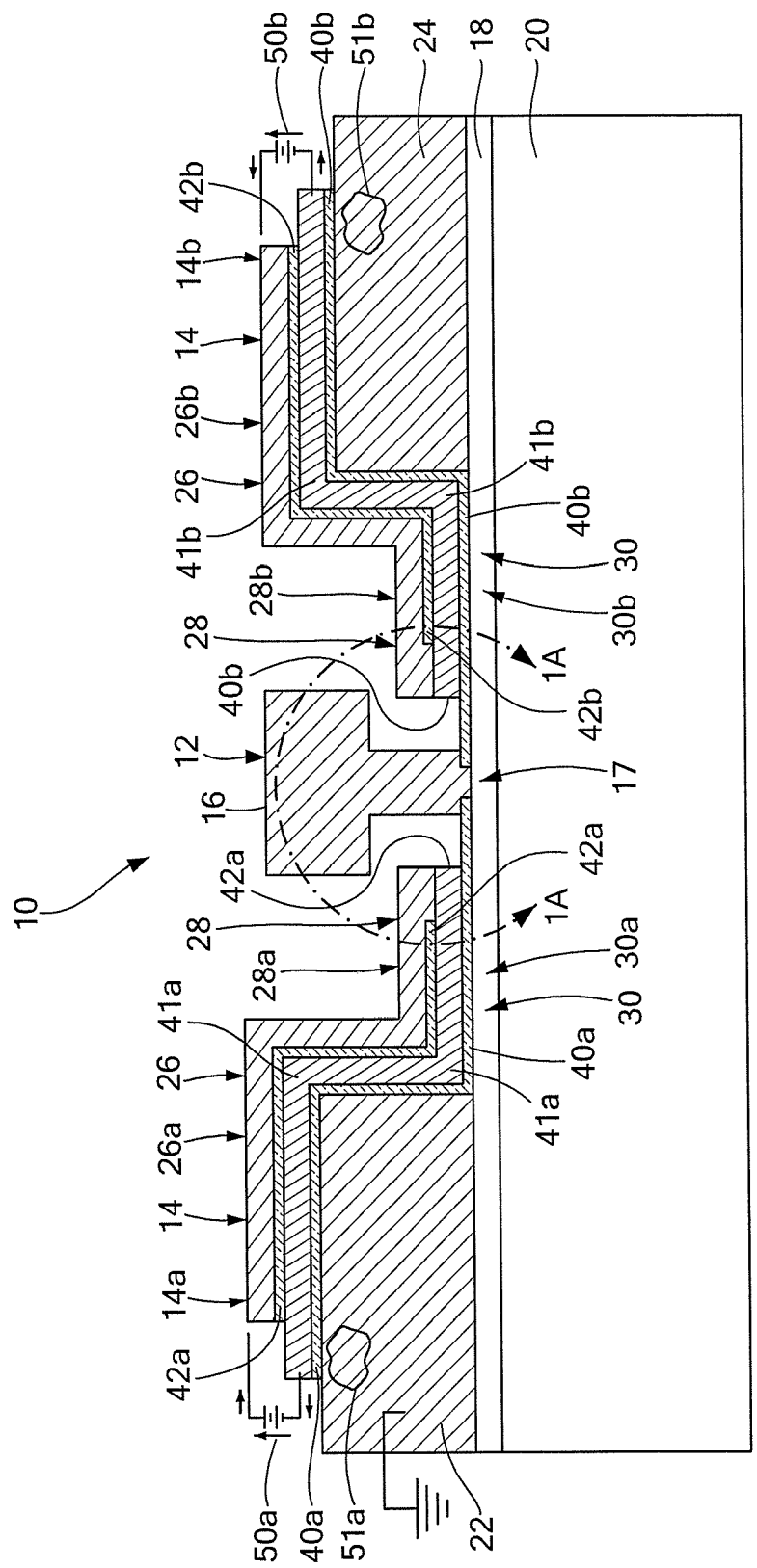
FIG. 1 is a cross sectional sketch of a semiconductor structure having a transistor and a thermo electronic structure according to the disclosure.

Referring now to FIG. 1, a semiconductor structure 10 is shown having a transistor 12 and a thermo electronic structure 14. The transistor 12, here for example a Field Effect Transistor (FET) has a control electrode 16, here a gate electrode, for controlling a flow of carriers through a channel region 17 beneath the control electrode 16 in the semiconductor layer 18, here for example, an AlGaN layer epitaxially formed on a GaN substrate 20, between a pair of electrodes, here Source and Drain electrodes, or contacts 22, 24, respectively.

The thermo electronic structure 14 has a first portion 26 disposed on at least one of the pair of electrodes, here on both electrodes 22 and 24, and a second portion 28 disposed over region 30s of the semiconductor layer 18 proximate the control electrode 16 between the control electrode 16 and said at least one of the pair of electrode 22, 24, here both electrodes 22, 24, as shown.

Thus, here the thermo electronic structure has a pair of thermo electronic structure sections 14a and 14b, a first one of the pair of thermo electronic structure sections 14a having the first portion 26a disposed on the source electrode 22 and a second portion 28a disposed over the region 30a of the semiconductor layer 18 proximate the control electrode 16 between the control electrode 16 and the source electrode 22. The second one of the pair of thermo electronic structure sections 14b has a first portion 26b disposed on the drain electrode 24 and a second portion 28b disposed over a region 30b of the semiconductor layer 18 proximate the control electrode 16 between the drain electrode 24. The first one of the pair of thermo electronics structure sections 14a extends from the first portion 26a to the second portion 28a for removing heat generated heat from said the region 30a between the control electrode 16 and the source electrode 22 and the second one of the pair of thermo electronic structure sections 14b extends from the first portion 26b to the second portion 28b for removing heat generated heat from the region 30b between the control electrode 16 and the drain electrode 24.

It is noted that the thermo electronics structure section 26a (FIG. 1A) is separated from the semiconductor layer 18 and the source electrode 22 by a first dielectric layer or film 40a of silicon dioxide or silicon nitride, for example, disposed on the source electrode 22 and extending over the semiconductor layer 18 from the source electrode 22 to the gate electrode 16, as indicated. Likewise, the thermo electronics structure section 26b is separated from the semiconductor layer 18 and the drain electrode 24 by a second dielectric layer or film 40b of silicon dioxide or silicon nitride, for example, disposed on the drain electrode 24 and extending over the semiconductor layer 18 from the drain electrode 24 to the gate electrode 16, as indicated.

Figure 1A:
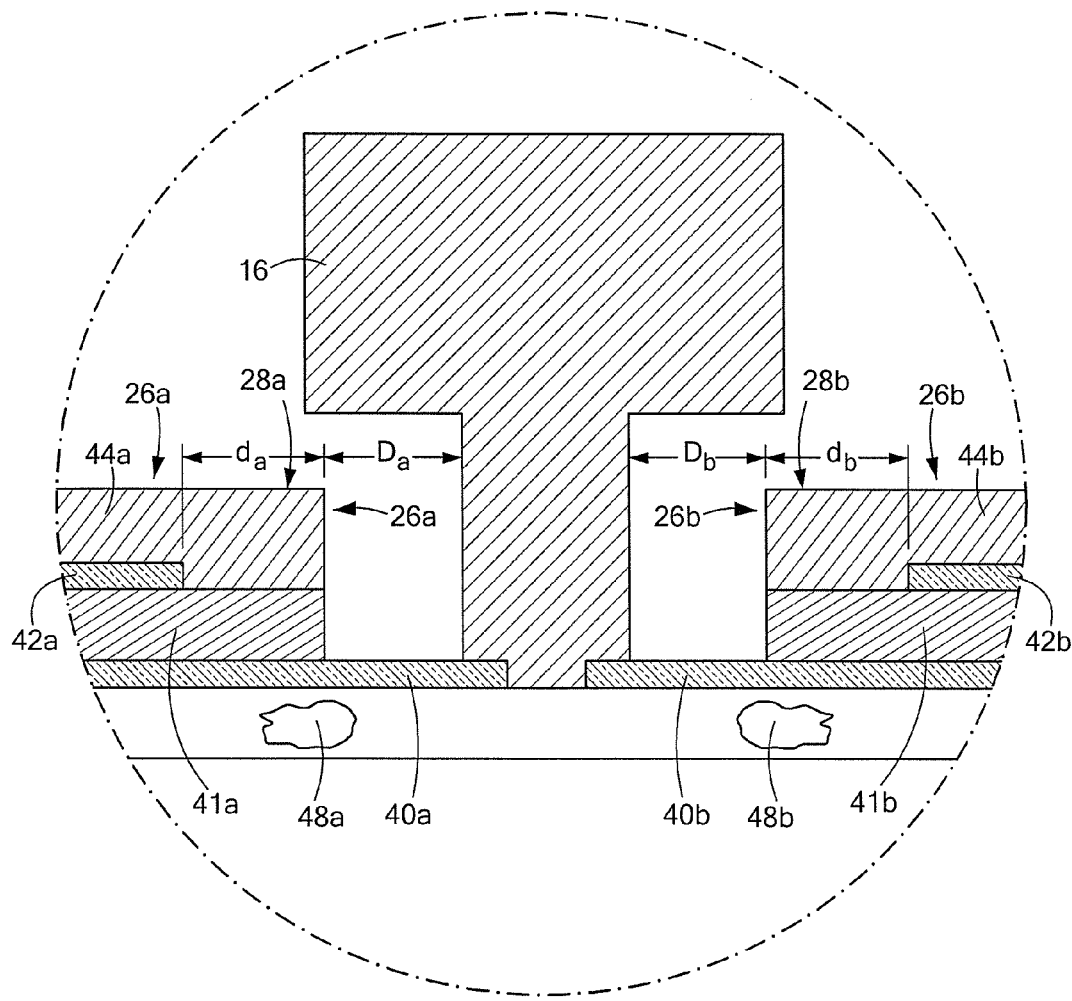
FIG. 1A is a cross sectional sketch of a portion of the semiconductor structure of FIG. 1, such portion being indicated by the arrow 1A-1A in FIG. 1.

Referring in more detail to the first one of the thermo electronics structure sections 26a, such section 26a includes: a first metal layer 41a of a first thermoelectric film, here for example Nickel, (Ni) disposed on a portion of the dielectric layer 40a, it being noted that the first metal layer 41a is separated from the gate electrode 16 a distance Da, as shown in FIG. 1A; and a second metal layer 44a of a second thermoelectric film, here for example Gold, (Au) disposed on the dielectric layer 42a and extend beyond the end of layer 41a a distance da so that the end of the metal layer 42a is in contact with the end portion of metal layer 41a at the portion 28a of the thermo electronics structure section 26a, as shown in FIG. 1A. Thus, it is noted that the layer 44a extends beyond the dielectric layer 42a a distance da, as shown in FIG. 1A. A voltage source 50a is connected between the metal layers 41a, and 44a and a Peltier effect is thereby produced between the metal layers 41a and 44a in the portion 28a of the thermo electronics structure section 26a resulting in heat being extracted from the hot region 48a between the gate electrode 16 and the source electrode 22 and transferred to the an ambient region 51a adjacent the source electrode 22. More particularly, with a voltage source 50a connected between the layers 41a, 44a at the first portion 14a of the first thermo electronic structure section 26a, a cold junction is formed at the region 48a between the control electrode 16 and the source electrode 22 relative to a region where the voltage source 50a is connected.

Referring in more detail to the second one of the thermo electronics structure sections 26b, such section 26b includes: a first metal layer 41b of the first thermoelectric film, here for example Nickel, (Ni) disposed on a portion of the dielectric layer 40b, it being noted that the first metal layer 41b is separated from the gate electrode 16 a distance Db, as shown in FIG. 1A; and a second metal layer 44b of the second thermoelectric film, here for example Gold, (Au) disposed on the dielectric layer 42b and extend beyond the end of layer 41b a distance db so that the end of the metal layer 42b is in contact with the end portion of metal layer 41b at the portion 28b of the thermo electronics structure section 26b, as shown in FIG. 1A. Thus, it is noted that the layer 44b extends beyond the dielectric layer 42b a distance db, as shown in FIG. 1A. A voltage source 50b is connected between the metal layers 41b, and 44b and a Peltier effect is thereby produced between the metal layers 41b and 44b in the portion 28b of thermo electronics structure section 26b resulting in heat being extracted from the hot region 48b between the gate electrode 16 and the drain electrode 24 and transferred to the an ambient region 51b adjacent the drain electrode 24. More particularly, with a voltage source 50b connected between the layers 41a, 44a at the second portion 14b of the second thermo electronic structure section 26b, a cold junction is formed at the region 48b between the control electrode 16 and the drain electrode 24 relative to a region where the voltage source 50b is connected.

Figure 2:
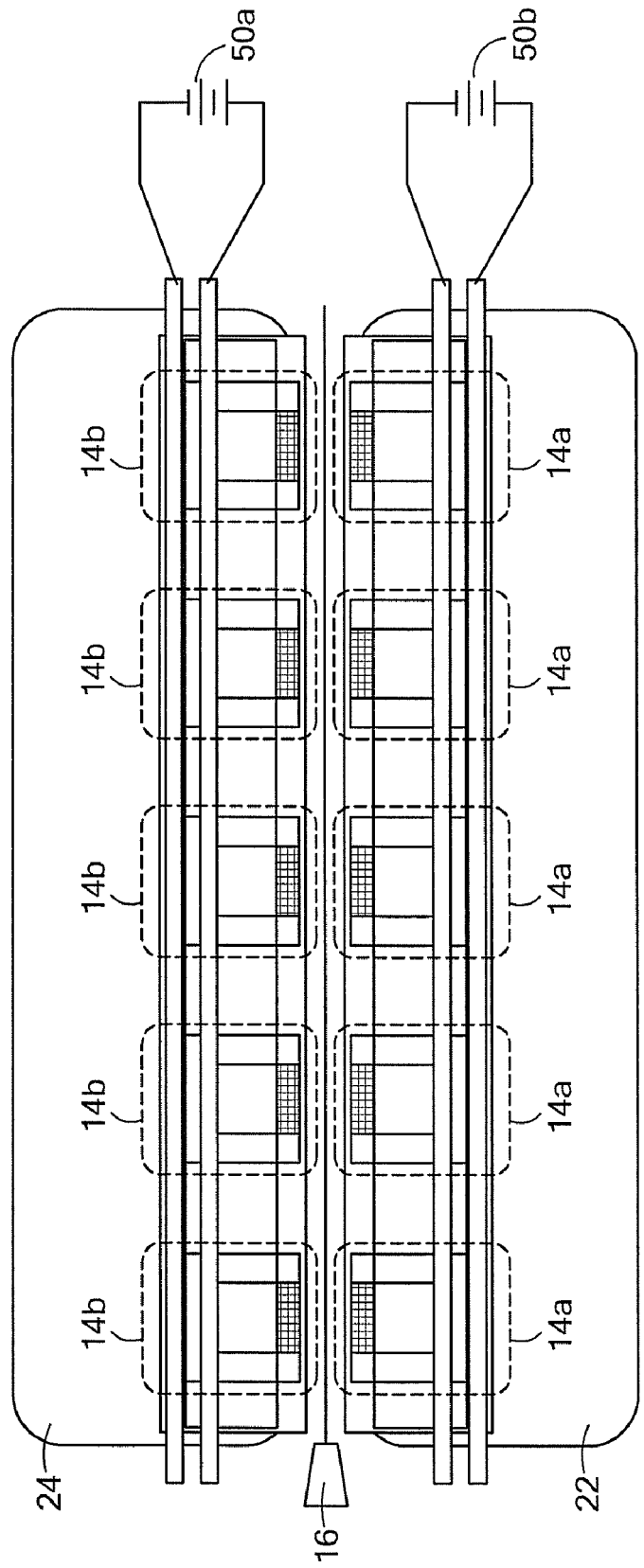
FIG. 2 is a plan view sketch of the having semiconductor structure of FIG. 1.

It is to be noted that the dielectric layers have thicknesses selected to provide the requisite thermal condition and electrical isolation Referring now to FIG. 2, here the transistor 2 has an elongated control electrode 16; and a plurality of the first and second thermo electronic structures disposed parallel to the elongated control electrode.

A number of embodiments of the disclosure have been described. Nevertheless, it will be understood that various modifications may be made without departing from the spirit and scope of the disclosure. For example, similar Silicon and GaAs devices can benefit this approach of localized heat re-distribution And other materials than those indicated can be used for Peltier junctions. Accordingly, other embodiments are within the scope of the following claims.

What is claimed is:

1. A semiconductor structure, comprising:
   (A) a transistor, comprising:
      a semiconductor layer;
      a control electrode for controlling a flow of carriers through the semiconductor layer between a pair of electrodes; and
   (B) a thermo electronic structure comprising:
      (i) a pair of layers of different materials;
      (ii) wherein a first portion of the thermo electronic structure is disposed on at least one of the pair of electrodes and a second portion of the thermo electronic structure is disposed over a region of the semiconductor layer [proximate the control electrode] between the control electrode and said at least one of the pair of electrode;
      (iii) a voltage source providing a voltage between the pair of layers; and
      (iv) wherein the thermo electronic structure extends from the first portion to the second portion for removing heat generated heat from said region in the semiconductor layer.

2. The semiconductor structure recited in claim 1 wherein the transistor is a field effect transistor and the electrodes are source and a drain contacts.

3. The semiconductor structure recited in claim 2 wherein the transistor is a GaN based transistor.

4. The semiconductor structure recited in claim 1 wherein the semiconductor structure includes:
   a first dielectric layer disposed between said first portion of the thermo electronic structure and said at least one of the pair of contacts; and
   wherein the first portion of the thermo electronic structure includes a second dielectric layer disposed between the pair of layers; and
   wherein the second portion of the thermo electronic structure includes the pair of layers in contact one with the other.

5. The semiconductor structure recited in claim 4 wherein the pair of layer in the second portion of the thermo electronic structure form a Peltier effect.

6. A semiconductor structure, comprising:
   (A) a transistor, comprising:
      a semiconductor layer;
      an elongated control electrode for controlling a flow of carriers through the semiconductor layer between a pair of electrodes; and
   (B) a plurality of thermo electronic structures disposed parallel to the elongated control electrode, each one of the thermo electronic structures comprising:
      (i) a pair of layers of different materials;
      (ii) wherein a first portion of the thermo electronic structure is disposed on at least one of the pair of electrodes and second portion of the thermo electronic structure is disposed over a region of the semiconductor layer

[proximate the control electrode and] between the control electrode and said at least one of the pair of electrode;

(iii) a voltage source providing a voltage between the pair of layers; and (iv) wherein such one of the thermo electronic structures extends from the first portion to the second portion for removing heat generated heat from said region in the semiconductor layer.

7. The semiconductor structure recited in claim 6 wherein the transistor is a field effect transistor and the electrodes are source and a drain contacts.

8. The semiconductor structure recited in claim 7 wherein the transistor is a GaN based transistor.

9. The semiconductor structure recited in claim 6 wherein the semiconductor structure includes:

a first dielectric layer disposed between said first portion of the thermo electronic structure and said at least one of the pair of contacts; and wherein the first portion of the thermo electronic structure includes a second dielectric layer disposed between the pair of layers; and wherein the second portion of the thermo electronic structure includes the pair of layers in contact one with the other.

10. The semiconductor structure recited in claim 9 wherein the pair of layers in the second portion of the thermo electronic structure form a Peltier effect.

11. A semiconductor structure, comprising:
(A) a transistor, comprising:
  (i) a semiconductor layer;
  (ii) a control electrode for controlling a flow of carriers through the semiconductor layer between a pair of electrodes; and
(B) a thermo electronic structure comprising:
  (i) a first layer of a first material;
  (ii) a second layer of a second material different from the first material;
  (iii) a voltage source providing a voltage between the pair of layers; and
  (iv) wherein:
    (a) a first portion of the thermo electronic structure is disposed on at least one of the pair of electrodes;
    (b) a second portion of the thermo electronic structure is disposed over a region of the semiconductor layer between the control electrode and said at least one of the pair of electrode; and
    (c) wherein the thermo electronic structure extends from the first portion to the second portion.

12. The semiconductor structure recited in claim 11 wherein the pair of layers in the second portion of the thermo electronic structure form a Peltier effect.

13. The semiconductor structure recited in claim 12 wherein the transistor is a field effect transistor and the electrodes are source and a drain contacts.

14. The semiconductor structure recited in claim 13 wherein the transistor is a GaN based transistor.

* * * * *